United States Patent [19]

Sakurai et al.

[11] Patent Number: 4,618,945
[45] Date of Patent: Oct. 21, 1986

[54] SEMICONDUCTOR MEMORY DEVICE

[75] Inventors: Takayasu Sakurai, Tokyo; Tetsuya Iizuka, Funabashi, both of Japan

[73] Assignee: Tokyo Shibaura Denki Kabushiki Kaisha, Japan

[21] Appl. No.: 517,419

[22] Filed: Jul. 26, 1983

[30] Foreign Application Priority Data

Aug. 11, 1982 [JP] Japan .............................. 57-138573
Nov. 19, 1982 [JP] Japan .............................. 57-202948

[51] Int. Cl.$^4$ ............................................. G11C 7/00
[52] U.S. Cl. .................................... 365/189; 365/190
[58] Field of Search ................. 365/189, 190, 154, 230

[56] References Cited

U.S. PATENT DOCUMENTS 4,156,940 5/1979 Hollingsworth et al. ........... 365/189
4,310,900 1/1982 Tsujide ................................ 365/190

FOREIGN PATENT DOCUMENTS 2354734 5/1974 Fed. Rep. of Germany .
2756267 6/1978 Fed. Rep. of Germany .

OTHER PUBLICATIONS

Minato et al., "A Hi-CMOSII 8Kx8b Static RAM," ISSCC Digest of Tech. Papers, pp. 256-257, Feb. 12, 1982.

Primary Examiner—Joseph A. Popek
Attorney, Agent, or Firm—Finnegan, Henderson, Farabow, Garrett & Dunner

[57] ABSTRACT

A semiconductor memory device has a plurality of memory cells arranged in a two-dimensional matrix array, word lines for connecting memory cells of each row to a row decoder, and bit lines for connecting memory cells of each column to a column decoder. The word lines include first word lines each of which is connected to several memory cells in each column section of one row. The word lines also include a second word line connected to the first word lines of each row through corresponding switches. In response to a column address signal, one of the switches of each row is turned on, so that one of the first word lines is connected to the corresponding second word line.

18 Claims, 31 Drawing Figures

F I G. 20A 
F I G. 20B 
F I G. 20C 
F I G. 20D 
F I G. 21 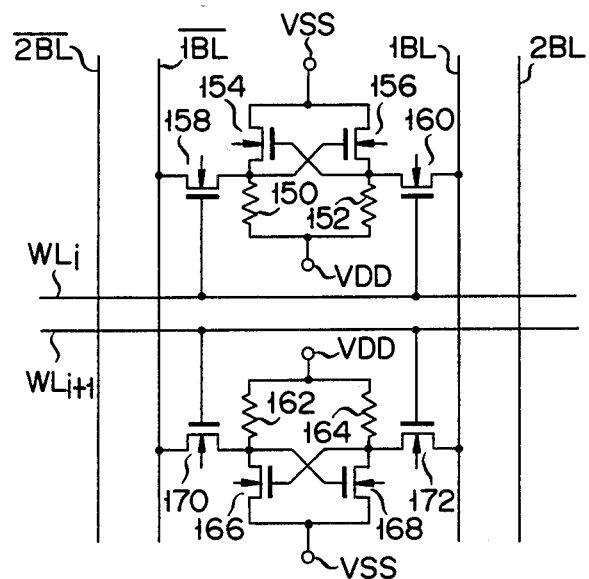
F I G. 23 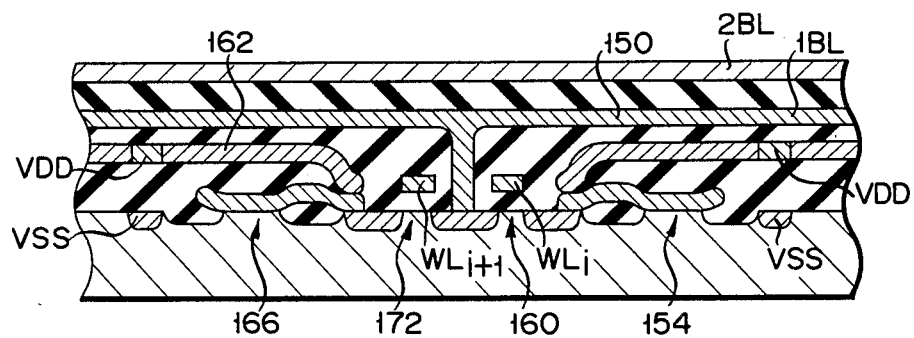

SEMICONDUCTOR MEMORY DEVICE

BACKGROUND OF THE INVENTION

The present invention relates to a large capacity semiconductor memory device.

In semiconductor memory devices, memory cells are generally arranged in a two-dimensional matrix. Memory cells of each row are connected to a row decoder through a corresponding word line. Memory cells of each column are connected to a column decoder through a corresponding bit line. When a row decoder and a column decoder are used to access a single cell in a matrix of memory cells, the decoders are used effectively and a plurality of cells can be accessed.

However, when storage capacity is increased in the above access system, the number of memory cells connected to a single word line and a single bit line is increased, resulting in the following drawback. In general, since the word line is constituted of polycrystalline silicon, it has a high resistance. Furthermore, since a number of memory cells are connected to the word line, the stray capacitance (earth capacitance) of the word line is increased. Therefore, the word line is regarded as a CR distributed line, and the word line delay affects the access time. Similarly, the stray capacitance of the bit line is great, resulting in bit line delay. However, the bit line is generally made of aluminum, which has low resistance, so that the cause of the bit line delay differs from that of the word line delay. The bit line is charged/discharged when data is read out from the memory cell. The charge/discharge time is regarded as the bit line delay time. When a static MOS memory is used, a capacitance C of the bit line and an ON-resistance R of a MOSFET for a transfer gate of the memory cell determine the charge/discharge time. The MOSFET is formed to have minimum dimensions in favor of the integrating density and has a small mutual conductance and a high ON resistance. For example, when a 256K bit MOS SRAM is considered, 512 memory cells are used for each column. The stray capacitance of the bit line is about 4 pF. The 4-pF X (supply voltage) charge is discharged over a time interval of 20 nsec. Therefore, this delay time accounts for a large portion of the total delay time (about 50 nsec).

Power consumption of the word line in addition to the delay time thereof becomes an issue. When a given memory cell is accessed, a word line connected thereto is selected. Subsequently, one row of memory cells including the given memory cell are activated, so that the data of memory cells aligned along one row are read out to the bit lines. Thereafter, only the desired bit line is selected and data is read out therefrom through a sense amplifier. When the memory cells are energized and data signals are read out therefrom to the bit lines, power is always consumed. Therefore, when the number of memory cells connected to each word line is increased, wasteful power consumption is increased. In general, power is greatly consumed when the memory cells are energized. For example, in the case of a CMOS SRAM, 90% or more of total power consumption occurs during energization of the memory cells. High power consumption leads to heat dissipation. Therefore, the conventional memory device cannot be highly integrated in accordance with conventional memory access methods.

SUMMARY OF THE INVENTION

It is, therefore, an object of the present invention to provide a large-capacity and high-speed semiconductor memory device. In order to achieve the above and other objects of the present invention, there is provided a semiconductor memory device comprising a plurality of memory cells arranged in a two-dimensional matrix array, memory cells of each row (column) being divided into a plurality of column (row) sections, first word (bit) lines connected to respective column (row) sections second word (bit) lines provided for the memory cells of each row (column), and a switch circuit connected between the first word (bit) lines and the second (bit) word line for connecting one of the first word (bit) lines of each row (column) to the second word (bit) line corresponding thereto.

BRIEF DESCRIPTION OF THE DRAWINGS

FIGS. 20A to 20D are timing charts for explaining the operation of the semiconductor memory device of the ninth embodiment;

FIG. 21 is a circuit diagram of two memory cells of the ninth embodiment;

FIG. 23 is a sectional view of the two memory cells along the line XXIII—XXIII' in FIG. 22.

DETAILED DESCRIPTION OF THE PREFERRED EMBODIMENTS

Figure 1:
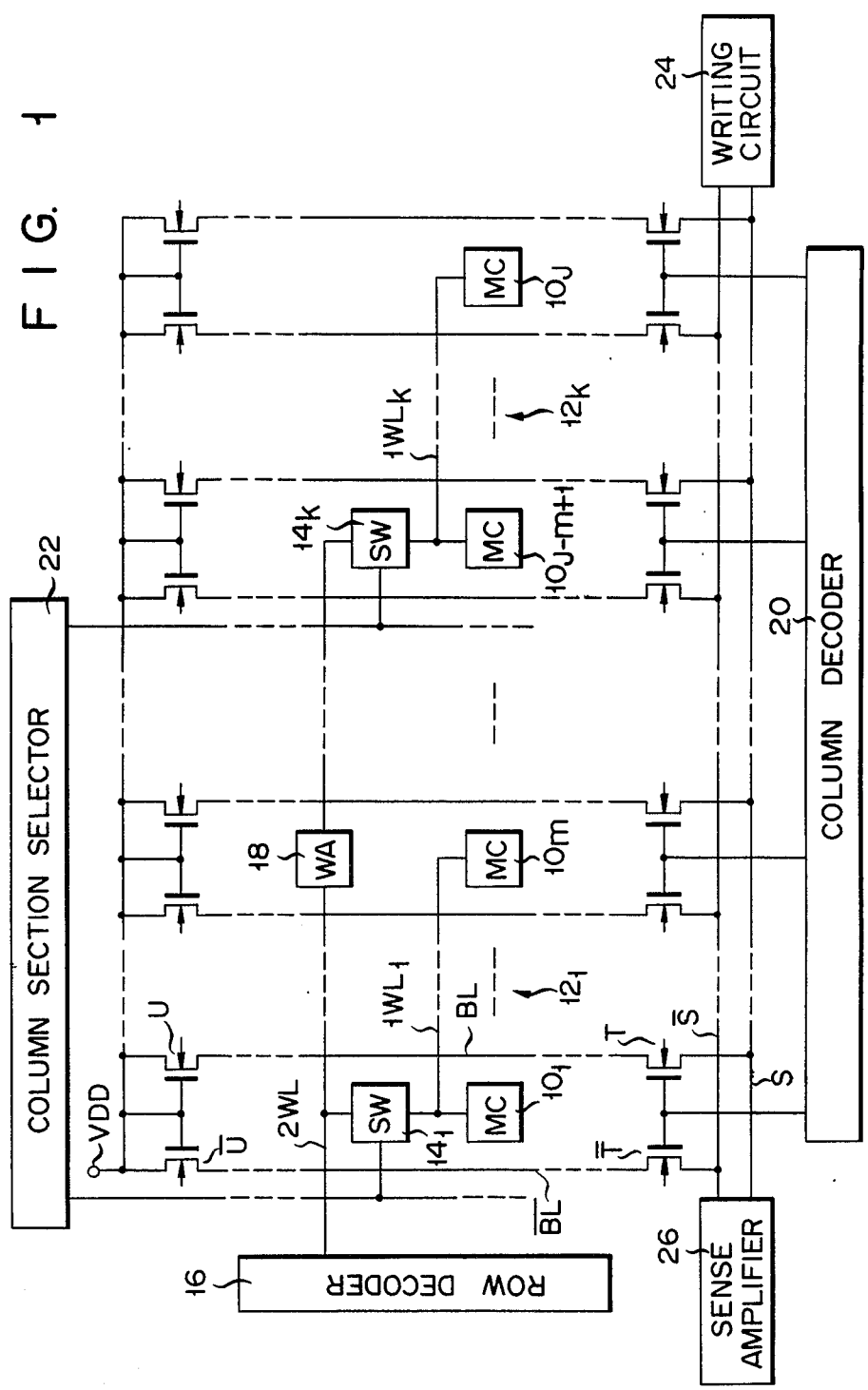
FIG. 1 is a block diagram of a semiconductor memory device having a double word line structure according to a first embodiment of the present invention.

A semiconductor memory device according to a first embodiment of the present invention will be described with reference to the accompanying drawings. FIG. 1 is a schematic block diagram of the semiconductor memory device of the first embodiment. Memory cells 10 are arranged in a matrix array (I rows×J columns). The memory cells $10_1$ to $10_J$ of each row are connected in the same manner. For the sake of simplicity, only memory cells arranged along one row are illustrated, and memory cells along other rows are omitted.

The memory cells $10_1$ to $10_J$ are divided into column sections $12_1$ to $12_k$ (k=J/m) each of which has m memory cells. Each of first word lines $1WL_1$ to $1WL_k$ is connected to the memory cells of the corresponding one of the column sections $12_1$ to $12_k$. The first word lines $1WL_1$ to $1WL_k$ are connected to a single second word line 2WL through switches $14_1$ to $14_k$, respectively. In this embodiment a single second word line and a plurality of first word lines are arranged for the memory cells of one row. The second word line 2WL is connected to a row decoder 16.

A word line intermediate amplifier 18 is arranged midway along the second word line 2WL. The memory cells of one column are commonly connected to bit lines BL and $\overline{BL}$. One end of each of the bit lines BL and $\overline{BL}$ is connected to the corresponding one of precharge load transistors U and $\overline{U}$. The other end of each of the bit lines BL and $\overline{BL}$ is connected to the corresponding one of sense lines S and $\overline{S}$ through bit line selection transistors T and $\overline{T}$. The load transistors U and $\overline{U}$ are n-channel MOSFETs of a normally ON type. The bit line selection transistors T and $\overline{T}$ are n-channel MOSFETs which are not normally ON. The gates of the transistors T and $\overline{T}$ are commonly connected, and the common gate is then connected to a column decoder 20. The switches of each column section are commonly connected to a column section selector 22. One end of each one of the sense lines S and $\overline{S}$ is connected to a writing circuit 24, and the other end thereof is connected to a sense amplifier 26.

Figure 2:
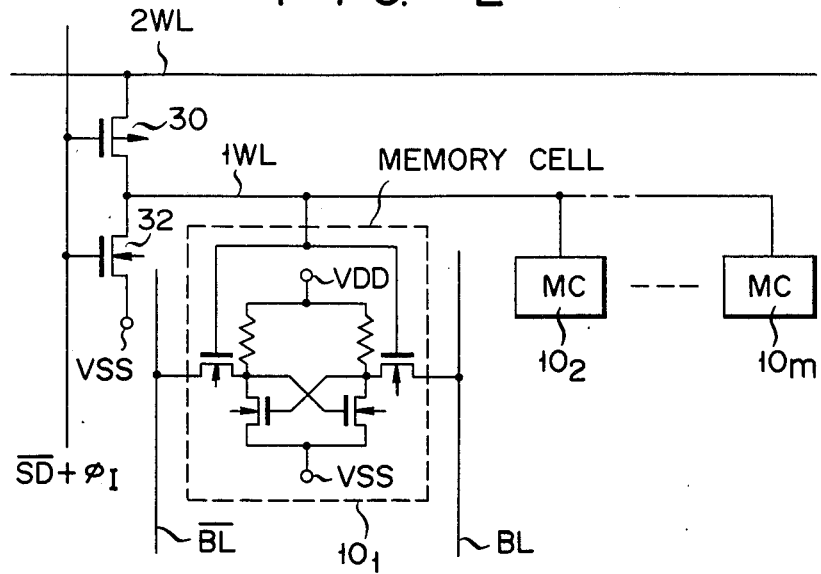
FIG. 2 is a circuit diagram of a switch of the device of the first embodiment.

FIG. 2 is a detailed circuit diagram of the memory cells $10_1$ to $10_m$ and the switch $14_1$ in one column section. It should be noted that the memory is a static MOS RAM and an E/R cell with a poly-Si resistor are included. The switch $14_1$ has a series circuit of a p-channel MOSFET 30 and an n-channel MOSFET 32. The drain of the p-channel MOSFET 30 is connected to the second word line 2WL, and the source thereof is connected to the corresponding first word line 1WL and to the drain of the MOSFET 32. The column section selector 22 has a column section decoder and a row address transient detector. Column section selection signal $\overline{SD}+\phi_I$ is supplied from the column section selector 22 to the gates of the MOSFETs 30 and 32. The signal $\overline{SD}$ is an inverted signal of the output signal from the column section decoder. The signal $\phi_I$ is generated as a word line inhibit pulse when the row address changes. When one row is divided into two sections, the MSB of the column address signal may be used as the signal SD.

Figure 3A:
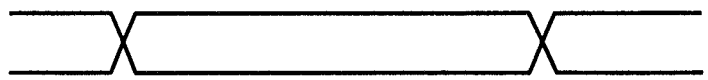
FIGS. 3A to 3F are timing charts for explaining the operation of the device of the first embodiment.
Figure 3B:
Figure 3C:
Figure 3D:
Figure 3E:
Figure 3F:

The memory cell access of the semiconductor memory device of the first embodiment will now be described with reference to the timing charts of FIGS. 3A to 3F. Assume that the target memory cell is located at ith row and jth column section. When the row address is switched, as shown in FIG. 3A, the ith row is selected. In this condition, the word line inhibit pulse $\phi_I$ is generated, as shown in FIG. 3B. The ith second word line $2WL_i$ is set at high level (VDD) by the row decoder 16 while the pulse $\phi_I$ is generated, as shown in FIG. 3C. In response to the column address signal, the column section decoder generates a jth column section decode signal $\overline{SD}_j$ shown in FIG. 3D. The column section selection signal $\overline{SD}_j+\phi_I$ from the column section selector 22 goes to low level (VSS) as shown in FIG. 3E. Therefore, the p-channel MOSFET 30 is turned on, and the n-channel MOSFET 32 is turned off. A voltage at the second word line $2WL_i$ is applied to the first word line $1WL_j$ through the p-channel MOSFET 30, so that the first word line $1WL_j$ goes high, as shown in FIG. 3F. As a result, the m memory cells of one column section which include the target cell are energized, and data are read out therefrom to the bit lines.

According to the first embodiment of the present invention, even when the word line of ith row (the second word line $2WL_i$) is selected, all the memory cells connected to this word line are not energized. Only the memory cells connected to one of the plurality of first word lines connected to the second word line are energized. In other words, the number of memory cells connected to the second word line is decreased to a fraction of the number of column sections (k in this embodiment) as compared with the number of cells connected in the conventional semiconductor memory device. For this reason, the stray capacitance of the word lines as a whole is decreased. Furthermore, when the length of the word line is decreased, the resistance thereof is also decreased and hence the word line delay is shortened. Even if the number of memory cells is increased, the access time is not increased, thereby obtaining a large-capacity memory. At the same time, power consumption is decreased, heat dissipation need not be considered, and a larger capacity memory can be obtained.

Referring again to FIGS. 3A to 3F, when the row address is switched as shown in FIG. 3A after the target memory cell is accessed, the pulse $\phi_I$ is generated as shown in FIG. 3B. The second word line $2WL_i$ goes low as shown in FIG. 3C. The column section selection signal $\overline{SD}_j+\phi_I$ goes high in synchronism with the leading edge of the pulse $\phi_I$, as shown in FIG. 3E. The p-channel MOSFET 30 is turned off, and the n-channel MOSFET 32 is turned on. As shown in FIG. 3F, the first word line $1WL_j$ goes low (VSS level). The memory cells connected to the first word line $1WL_j$ are deenergized. Thereafter, when the column address signal changes, the column section decode signal $\overline{SD}_j$ goes to high level, as shown in FIG. 3D.

Figure 4:
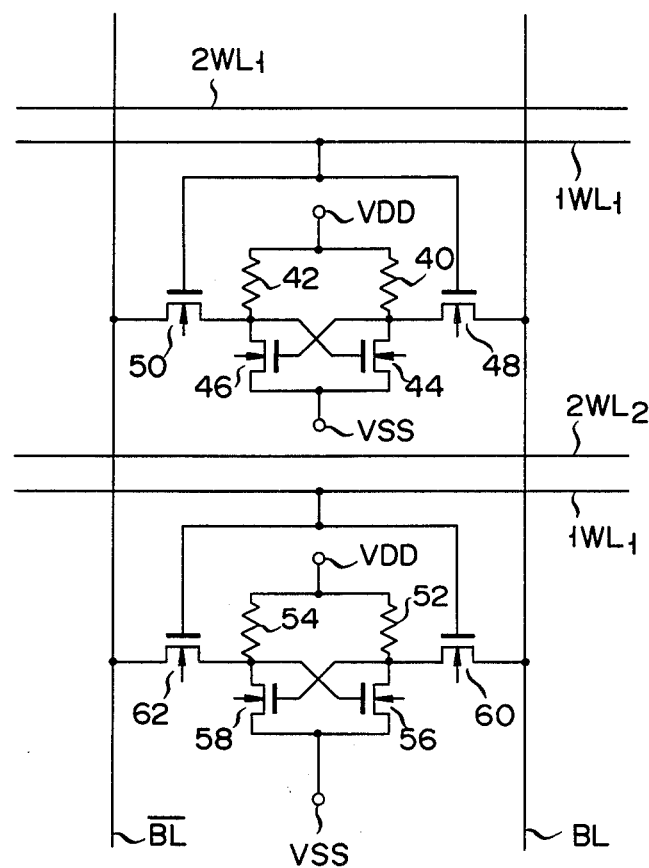
FIG. 4 is a circuit diagram showing two memory cells of the device of the first embodiment.
Figure 5:
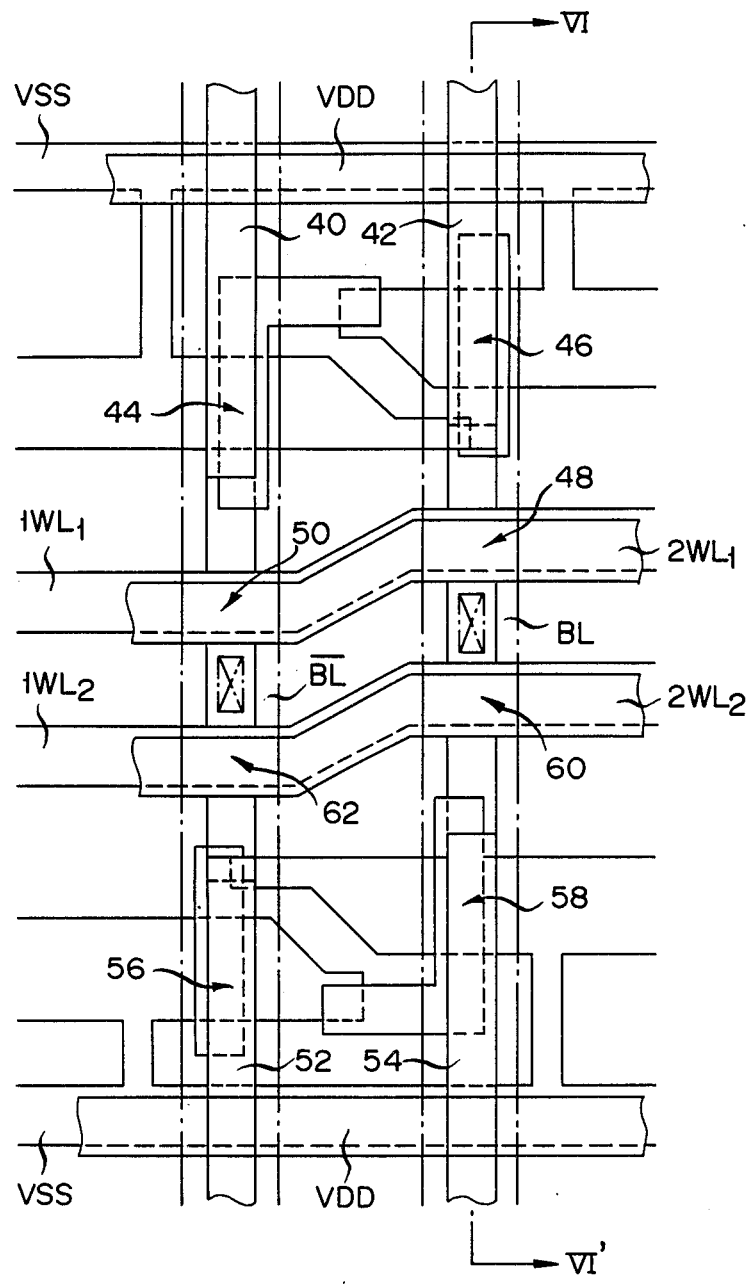
FIG. 5 is a plan view showing the pattern of the two memory cells shown in FIG. 4.
Figure 6:
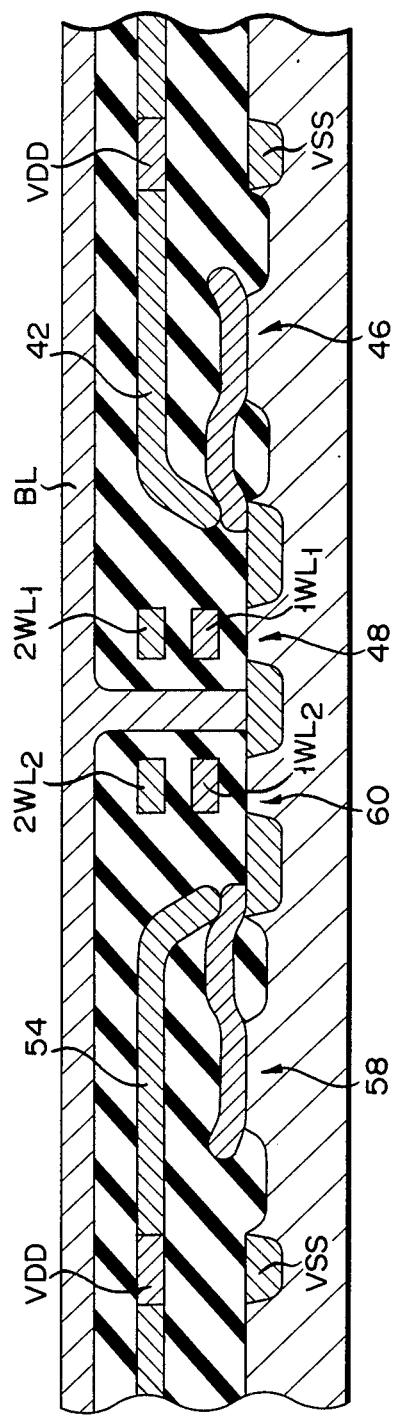
FIG. 6 is a sectional view of the memory cells along the line VI—VI' in FIG. 5.

Unlike the conventional semiconductor memory device, the semiconductor memory device of this embodiment has a double-word line structure. This can be achieved by a two-layer structure of the first and second word lines. The element structure of this embodiment will be described below. FIG. 4 shows two memory cells for two rows and the first and second word lines. FIG. 5 is a plan view showing the pattern of the circuit element shown in FIG. 4. FIG. 6 is a sectional view of the circuit element taken along the line VI—VI' in FIG. 5. The same reference numerals denote the same parts throughout FIGS. 4 to 6.

Each of the two memory cell patterns is symmetrical about the central portion thereof which contacts the bit lines. A plurality of first word lines for each column section of one row are formed in the first layer, and a single second word line for the one row is formed as the second layer on the first word lines. The first and second word lines are made of polycrystalline silicon. The second polycrystalline silicon layer also constitutes high-resistance loads 40, 42, 52 and 54. The second word line is formed by partially forming a low-resistance layer such as MoSi$_2$ on the second polycrystalline silicon layer or by diffusing an impurity of high concentration in the second polycrystalline silicon layer, thereby obtaining a low-resistance second word line. Since a two-layer word line structure is obtained, word line delay is prevented and wasteful power consumption is decreased without increasing the area of memory cells.

Figure 7:
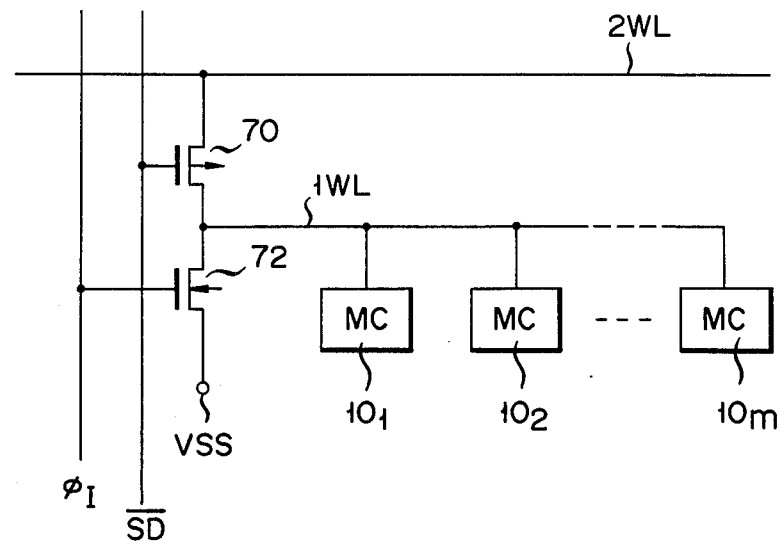
FIG. 7 is a circuit diagram of a switch according to a second embodiment of the present invention.

Semiconductor memory devices according to other embodiments of the present invention will be described. These embodiments are concerned with modifications of switches for connecting the memory cells of each column section and the second word line. In the second embodiment shown in FIG. 7, the same switch as in the first embodiment is used. The switch has a p-channel MOSFET 70 connected between a second word line 2WL and the corresponding first word line 1WL and an n-channel MOSFET 72 connected between the corresponding first word line 1WL and a ground terminal VSS. Unlike the first embodiment, the gates of the MOSFETs 70 and 72 are connected to different signal lines, respectively. The signal $\overline{SD}$ from the column section decoder is supplied to the gate of the p-channel MOSFET 70, and the word line inhibit signal $\phi_I$ is supplied to the gate of the n-channel MOSFET 72.

The timing charts shown in FIGS. 3A to 3F are applicable without modification to the operation of the device of the second embodiment. More particularly, when the row address changes, the word line inhibit signal $\phi_I$ is being generated. During this period, the n-channel MOSFET 72 is kept on, and the first word line 1WL is kept at low level. Meanwhile, the second word line 2WL becomes high level. When the word line inhibit signal $\phi_I$ goes low, the signal $\overline{SD}$ from the column section decoder goes low. The p-channel MOSFET 70 is then turned on, and the high-level signal is supplied from the second word line 2WL to the first word line 1WL. As a result, the memory cells 10$_l$ to 10$_m$ of one column section are energized. When the memory cell access is completed, the row address changes and the word line inhibit signal $\phi_I$ is generated. The n-channel MOSFET 72 is turned on, so that the potential of the first word line 1WL is set at low level.

Figure 8:
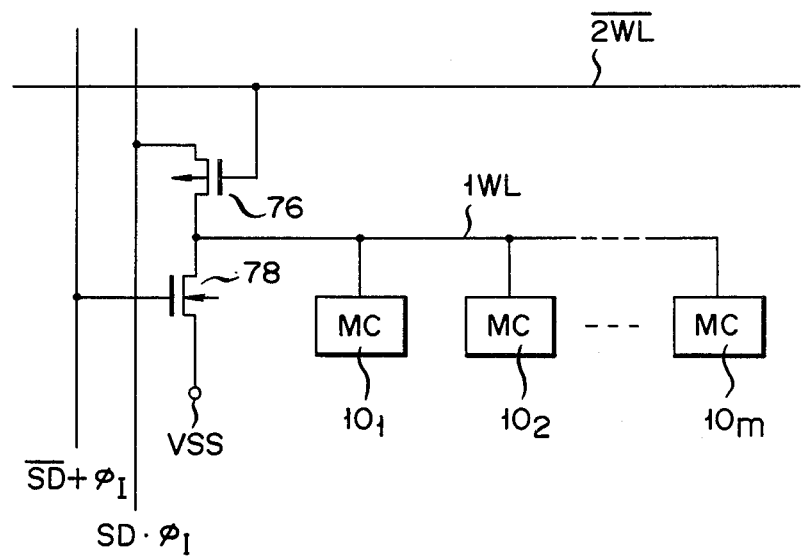
FIG. 8 is a circuit diagram of a switch according to a third embodiment of the present invention.

FIG. 8 shows a semiconductor memory device according to a third embodiment of the present invention. In this embodiment, since a signal obtained by inverting an output signal from a row decoder is supplied to a second word line, the second word line is designated by 2WL. In the first and second embodiments, the second word line 2WL is connected to the drain of the switching MOSFET. However, in the third embodiment, the second word line 2WL is connected to the gate of a switching MOSFET. The arrangement in the first and second embodiments is called a drain input structure, and the arrangement in the third embodiment is called a gate input structure.

Referring to FIG. 8, the second word line 2WL is connected to the gate of a p-channel MOSFET 76, and a first word line 1WL is connected to the source of the p-channel MOSFET 76 and to the drain of an n-channel MOSFET 78. A signal SD·$\phi_I$ is supplied to the drain of the MOSFET 76, and a signal $\overline{SD}+\phi_I$ is supplied to the gate of the MOSFET 78.

The operation of the semiconductor memory device of the third embodiment will now be described. When the word line inhibit signal $\phi_I$ goes to high level and the second word line 2WL goes low, the MOSFET 76 is turned on. Even if the signal $\phi_I$ goes to low level, the signal SD is set at high level. Therefore, the first word line 1WL is set at high level, and the memory cells of one column section are energized. When the memory access is completed, the second word line 2WL goes high and the p-channel MOSFET 76 is turned off. The signal $\overline{SD}+\phi_I$ is then set at high level, so that the n-channel MOSFET 78 is turned on. For this reason, the first word line 1WL goes to low level. The gate input structure of this embodiment has a rectifying function at the MOSFET 76 and a shorter delay time than that of the drain input structure.

In the three embodiments described above, the switch for selecting the first word line is arranged at one end of the first word line. However, when the first word line delay is substantially the same as the second word line delay, the switch must be arranged at the center of the first word line so as to decrease the first word line delay, as will be described below.

Figure 9:
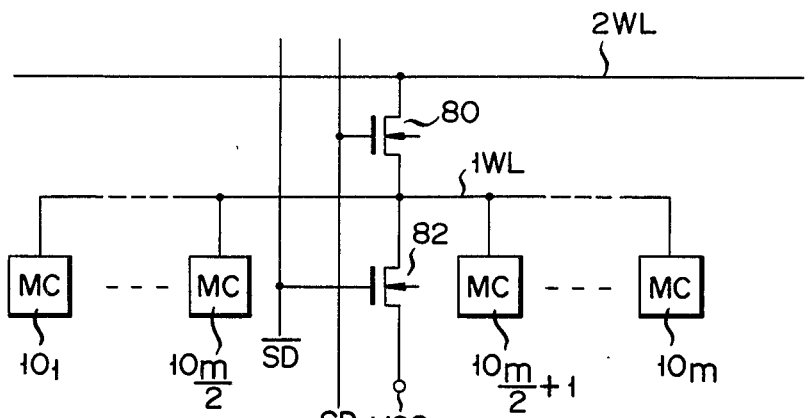
FIG. 9 is a circuit diagram of a switch according to a fourth embodiment of the present invention.

In a fourth embodiment shown in FIG. 9, a switch comprises n-channel MOSFETs 80 and 82 series-connected between a second word line 2WL and a ground terminal VSS. A connecting point between the MOSFETs 80 and 82 is connected to a first word line 1WL at an intermediate portion (i.e., between memory cells 10$_{m/2}$ and 10$_{(m/2)+1}$) of the memory cells of one column section. Signals SD and $\overline{SD}$ are supplied to the gates of the MOSFETs 80 and 82, respectively. In this embodiment, the MOSFET 80 is turned on in response to the signal SD upon selection of the column section. When the memory access is completed, the MOSFET 82 is turned on in response to the signal $\overline{SD}$.

According to the fourth embodiment described above, the switch comprises only n-channel MOSFETs. When the memory cells are constituted of only n-channel MOSFETs, a CMOS structure need not be used, thereby preventing an increase in the element area and the latch-up phenomenon.

If the n-channel MOSFET 80 is of an enhancement type, the potential at the first word line 1WL is lower than that at the second word line by a threshold voltage of the MOSFET 80. In this case, a pull-up resistor is used to increase the voltage level of the signal $\overline{SD}$ over VDD level so as to decrease the ON resistance of the MOSFET 80, thereby reliably energizing the memory cell. However, if the n-channel MOSFET 80 is of a depletion type, the charges on the first word line are discharged to the second word line through the MOSFET 80 when the second word line goes low. Thus, the delay on the first word line may be reduced.

Figure 10:
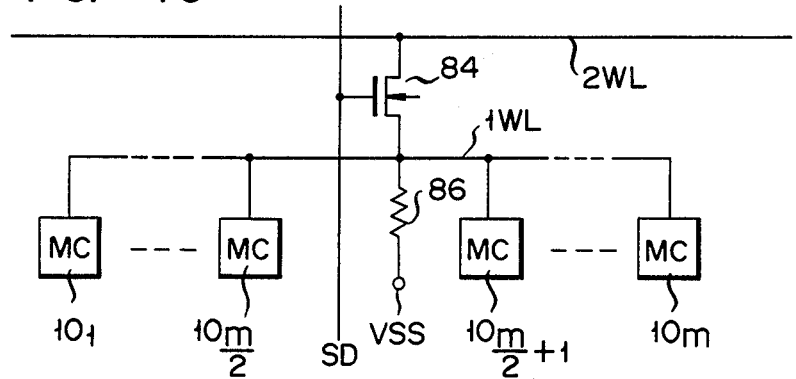
FIG. 10 is a circuit diagram of a switch according to a fifth embodiment of the present invention.

FIG. 10 shows a semiconductor memory device according to a fifth embodiment of the present invention. A switch has an n-channel MOSFET 84 and a resistor 86 series-connected between a second word line 2WL and a ground terminal VSS. The drain of the n-channel MOSFET 84 is connected to the second word line 2WL, and the source thereof is connected to a first word line 1WL. A signal SD is supplied to the gate of the MOSFET 84.

In this embodiment, the MOSFET 84 is turned on in response to the signal SD so as to energize the memory cells. Then the MOSFET 84 is turned off to discharge the charges on the first word line 1WL through the resistor 86, thereby deenergizing the memory cells. It should be noted that the resistor 86 may be formed by a multi-layer structure. The structure in the fifth embodiment is suitable for manufacturing a compact, large-capacity memory device. When the n-channel MOSFET 84 is of an enhancement type, the signal SD must be pulled up over VDD in the same manner as in the fourth embodiment.

In the above embodiment, when the MOSFET 84 is kept ON and the second word line 2WL is set at high level, a DC current flows through the MOSFET 84 and the resistor 86, thereby consuming power. However, this occurs only in one location in the entire chip. Therefore, this power consumption is negligible. The first word line is discharged through the resistor 86 when the column section is switched to another column section within one row. The discharge time is independent of the access time, so that it may be prolonged only in consideration of power consumption. Therefore, the resistance of the resistor 86 is set such that the potential on the first word line, which is obtained by dividing the potential on the second word line with the ratio between the ON resistance of the MOSFET 84 and the resistance of the resistor 86, is high enough to energize the memory cells. The resistance of the resistor 86 need not be set at a low resistance.

As a modification (not shown) of the above embodiment, it is assumed that a p-channel MOSFET is used in place of the n-channel MOSFET 84, and that a signal $\overline{SD}$ is supplied to the gate of the p-channel MOSFET. According to this modification, the charges on the first word line are mainly discharged to the second word line through the p-channel MOSFET. It should be noted that a voltage corresponding to the threshold of the p-channel MOSFET is discharged through the resistor.

Figure 11:
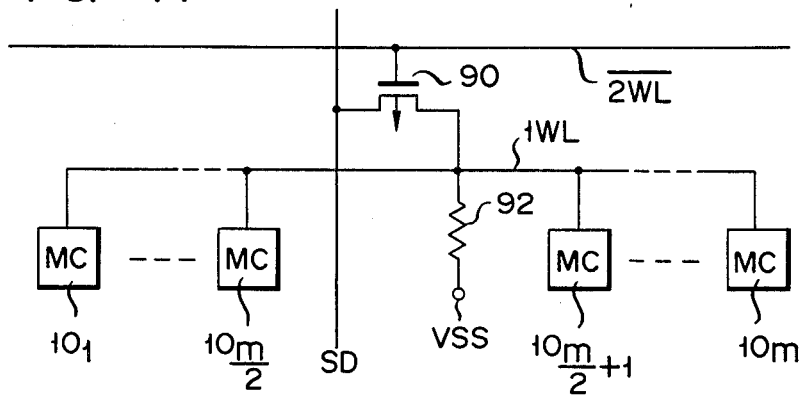
FIG. 11 is a circuit diagram of a switch according to a sixth embodiment of the present invention.

A semiconductor memory device according to a sixth embodiment of the present invention is shown in FIG. 11. A second word line 2WL is connected to the gate of a p-channel MOSFET 90, and the source thereof is connected to the first word line, and also to a ground terminal VSS through a resistor 92. The signal SD is supplied to the drain of the MOSFET 90.

In this embodiment, when the signal SD is set at high level and the second word line 2WL is set at low level, the MOSFET 90 is turned on and the first word line 1WL is set at high level. Even in this embodiment, the charges on the first word line 1WL are discharged mainly through the MOSFET 90.

In the above embodiments, each of the first word lines is arranged at one side of the second word line. However, a seventh embodiment shown in FIG. 12 may be implemented. More particularly, first word lines 1WL$_i$ and 1WL$_j$ are arranged one at each side of a second word line 2WL. P-channel MOSFETs 94$_i$ and 94$_j$ are connected between the second word line 2WL and the first word line 1WL$_i$ and between the second word line 2WL and the first word line 1WL$_j$, respectively. Resistors 96$_i$ and 96$_j$ are connected between the first word line 1WL$_i$ and a ground terminal VSS and between the first word line 1WL$_j$ and the ground terminal VSS, respectively. Signals $\overline{SD}_i$ and $\overline{SD}_j$ are supplied to the gates of the MOSFETs 94$_i$ and 94$_j$, respectively.

Figure 12:
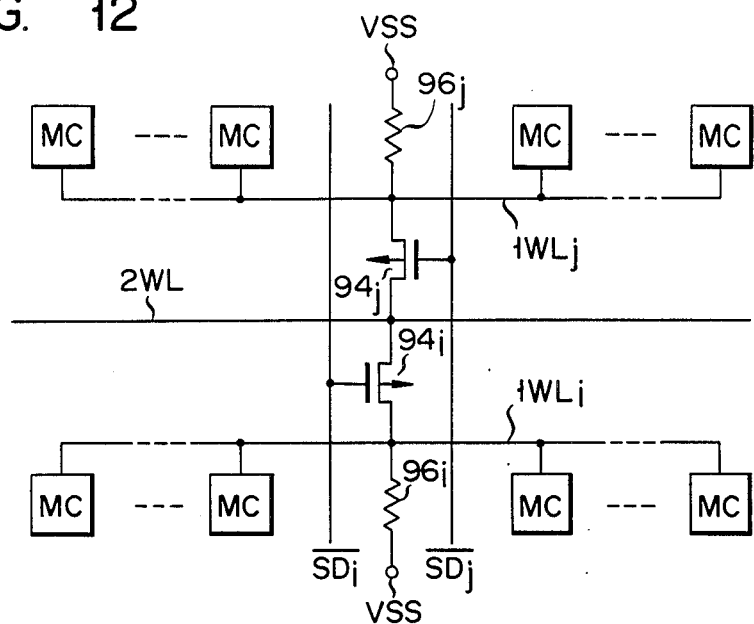
FIG. 12 is a circuit diagram of a switch according to a seventh embodiment of the present invention.
Figure 13:
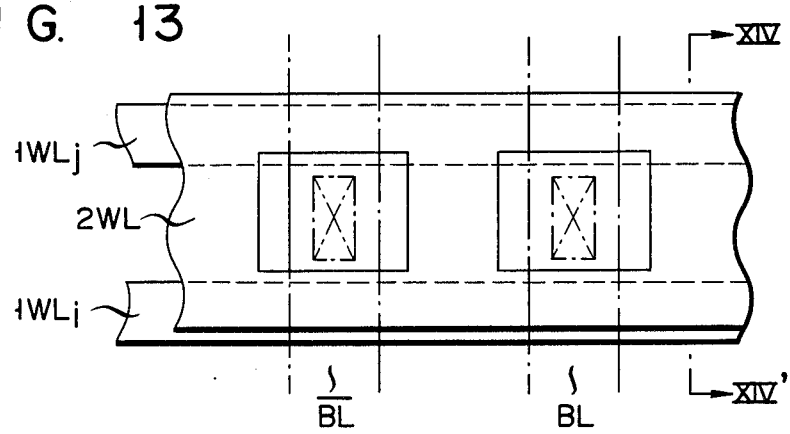
FIG. 13 is a plan view showing the pattern of the switches of the seventh embodiment.
Figure 14:
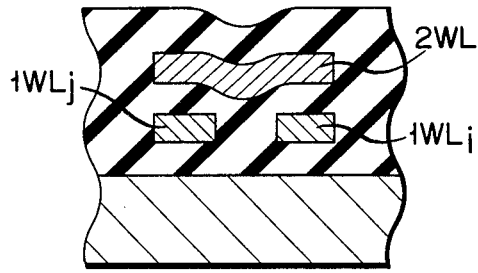
FIG. 14 is a sectional view of the switches along the line XIV—XIV' in FIG. 13.

FIG. 13 is a plan view showing the pattern of part of the device shown in FIG. 12. FIG. 14 is a sectional view of the part taken along the line XIV—XIV' in FIG. 13. As may be apparent from FIGS. 13 and 14, the single second word line 2WL can be commonly used for the two first word lines 1WL$_i$ and 1WL$_j$. In order to decrease the resistance of the second word line and the delay on the second word line, it is preferred to widen the second word line.

Figure 15:
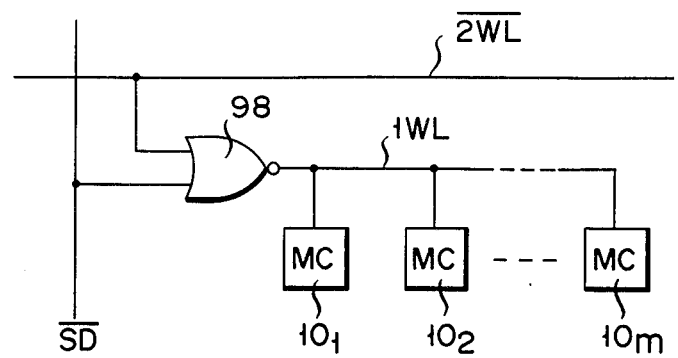
FIG. 15 is a circuit diagram of an eighth embodiment of the present invention in which a logic circuit is used as a switch.
Figure 16:
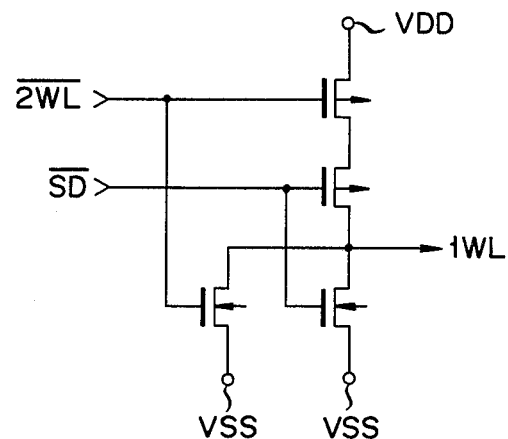
FIG. 16 is a circuit diagram of a NOR gate used in the switch of the eighth embodiment.

In the above embodiments, all the switches are transfer gates comprising MOSFETs. If the signal on the second word line is not synchronized with the output signal from the column section selector because of manufacturing variations, the transfer gate is kept ON, and the corresponding cells are not deenergized. In order to prevent this, in an eighth embodiment shown in FIG. 15, a logic circuit is used as a switch. More particularly, a NOR gate 98 is used as the switch. The input terminals of the NOR gate 98 are connected to a second word line 2WL and an $\overline{SD}$ signal line. The output terminal of the NOR gate 98 is connected to a first word line 1WL. The NOR gate comprises four elements as shown in FIG. 16. An AND gate may be used in place of the NOR gate 98. However, such an AND gate comprises six elements so that the cell area is increased, thus resulting in an impractical arrangement.

According to this embodiment, when the second word line 2WL and the $\overline{SD}$ signal line both go to low level, the first word line 1WL goes high and the cells are energized. In order to deenergize the cells, at least one of the second word line 2WL and the $\overline{SD}$ signal line is set at high level, irrespective of the rising edge timings of the 2WL and $\overline{SD}$ signals. As a result, the memory cells can be reliably energized/deenergized.

As is apparent from the above description, since the double-word line structure is used, the word line delay and the power consumption are decreased so as to obtain a high-speed large-capacity memory. In the above description, the memory cells are energized when the first word line is set at high level. However, the memory cells may be energized when the first word line is set at low level. In this case, the channel type of the MOSFET switch is inverted, and the level of the column section selection signal is inverted. Furthermore, in the above embodiment, the second word line is formed of polycrystalline silicon. However, the second word line may be formed of a second aluminum layer. In this case, the second word line is sufficiently spaced apart from the first word line, and the stray capacitance is further decreased. In addition to this advantage, since aluminum has a low resistivity, the delay time of the second word line is shortened, resulting in convenience.

Figure 17:
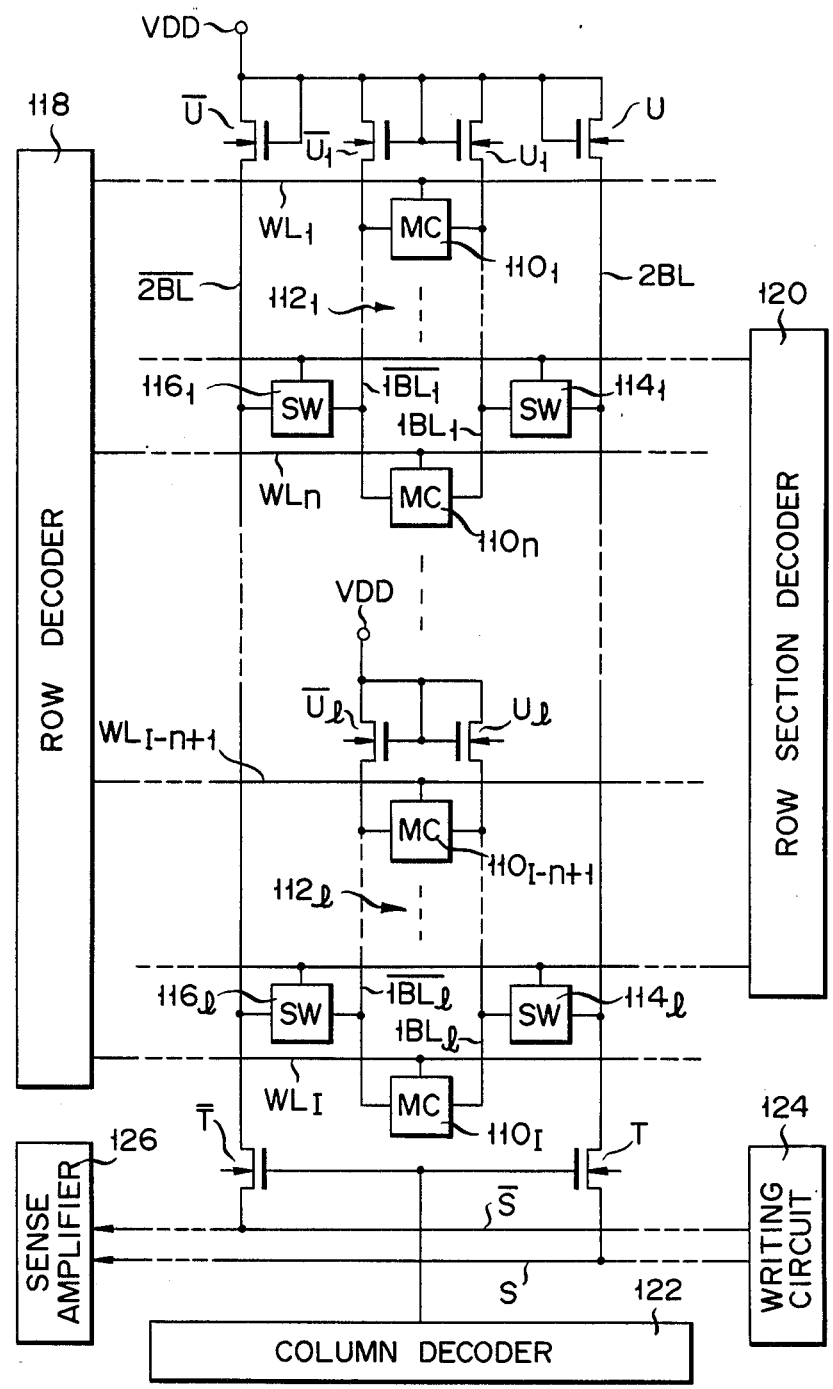
FIG. 17 is a block diagram of a semiconductor memory device having a double bit line structure according to a ninth embodiment of the present invention.

The above embodiments are concerned with the double word line structure. The following embodiment will be concerned with a double-bit line structure. FIG. 17 is a schematic block diagram of a semiconductor memory device according to a ninth embodiment. Memory cells 110 are arranged in a matrix form (I rows×J columns). The connections of the memory cells 110$_1$ to 110$_I$ of each column are the same. For the sake of simplicity, only the memory cells of one column are illustrated. These memory cells comprise E/R cells of an SRAM. The memory cells 110$_1$ to 110$_I$ are divided into row sections 112$_1$ to 112$_1$ (l=I/n). Each row section 112 has n memory cells. Each of first bit lines 1BL$_1$ to 1BL$_1$ and each of first bit lines $\overline{1BL}_1$ to $\overline{1BL}_1$ are respectively connected to the corresponding one of the row sections 112$_1$ to 112$_1$.

The first bit lines 1BL$_1$ to 1BL$_1$ are connected to a second bit line 2BL through switches 114$_1$ to 114$_1$, respectively. The first bit lines $\overline{1BL}_1$ to $\overline{1BL}_1$ are connected to a second bit line $\overline{2BL}$ through switches 116$_1$ to $116_1$, respectively. One end of each of the first bit lines $1BL_1$ to $1BL_1$ is connected to a corresponding one of precharge load transistors $U_1$ to $U_1$. One end of each of the first bit lines $\overline{1BL}_1$ to $\overline{1BL}_1$ is connected to a corresponding one of the precharge load transistors $\overline{U}_1$ to $\overline{U}_1$. One end of each of the second bit lines 2BL and $\overline{2BL}$ is connected to a corresponding one of the load transistors U and $\overline{U}$. The load transistors U and $\overline{U}$ may be omitted. In this case, one end of each of the second bit lines 2BL and $\overline{2BL}$ is directly connected to a power source terminal VDD. The other end of each of the second bit lines 2BL and $\overline{2BL}$ is connected to a corresponding one of sense lines S and $\overline{S}$ through a corresponding one of bit line selection transistors T and $\overline{T}$.

The memory cells $110_1$ to $110_J$ of each row are connected to a row decoder 118 through word lines $WL_1$ to $WL_J$, respectively. The switches $114_1$ to $114_1$ are connected together with the switches $116_1$ to $116_1$ to a row section decoder 120. In this embodiment, two types of bit lines 1BL ($\overline{1BL}$) and 2BL ($\overline{2BL}$) are arranged for the memory cells of each column. The second bit line 2BL ($\overline{2BL}$) is connected to the plurality of first bit lines 1BL ($\overline{1BL}$). The gates of the bit line selection transistors T and $\overline{T}$ are commonly connected, and the common gate is connected to a column decoder 122. One end of each of the sense lines S and $\overline{S}$ is connected to a writing circuit 124, and the other end thereof is connected to a sense amplifier 126.

In the ninth embodiment, the switches 114 and 116 connected between the first and second bit lines must comprise bidirectional transfer means. For example, a transfer gate (FIG. 18) of a single MOSFET or a bidirectional amplifier (FIG. 19) of four MOSFETs may be used as the bidirectional transfer means. More particularly, referring to FIG. 18, p-channel MOSFETs $130_i$ and $130_{i+1}$ are connected between the second bit line 2BL and the first bit line $1BL_i$ and between the second bit line 2BL and the first bit line $1BL_{i+1}$, respectively. P-channel MOSFETs $132_i$ and $132_{i+1}$ are connected between the second bit line $\overline{2BL}$ and the first bit line $\overline{1BL}_i$ and between the second bit line $\overline{2BL}$ and the first bit line $\overline{1BL}_{i+1}$, respectively. An output signal $\overline{SD}_i$ from the row section decoder 120 is supplied to the gates of the MOSFETs $130_i$ and $132_i$. An output signal $\overline{SD}_{i+1}$ from the row section decoder 120 is supplied to the gates of the MOSFETs $130_{i+1}$ and $132_{i+1}$.

Figures 18, 19:
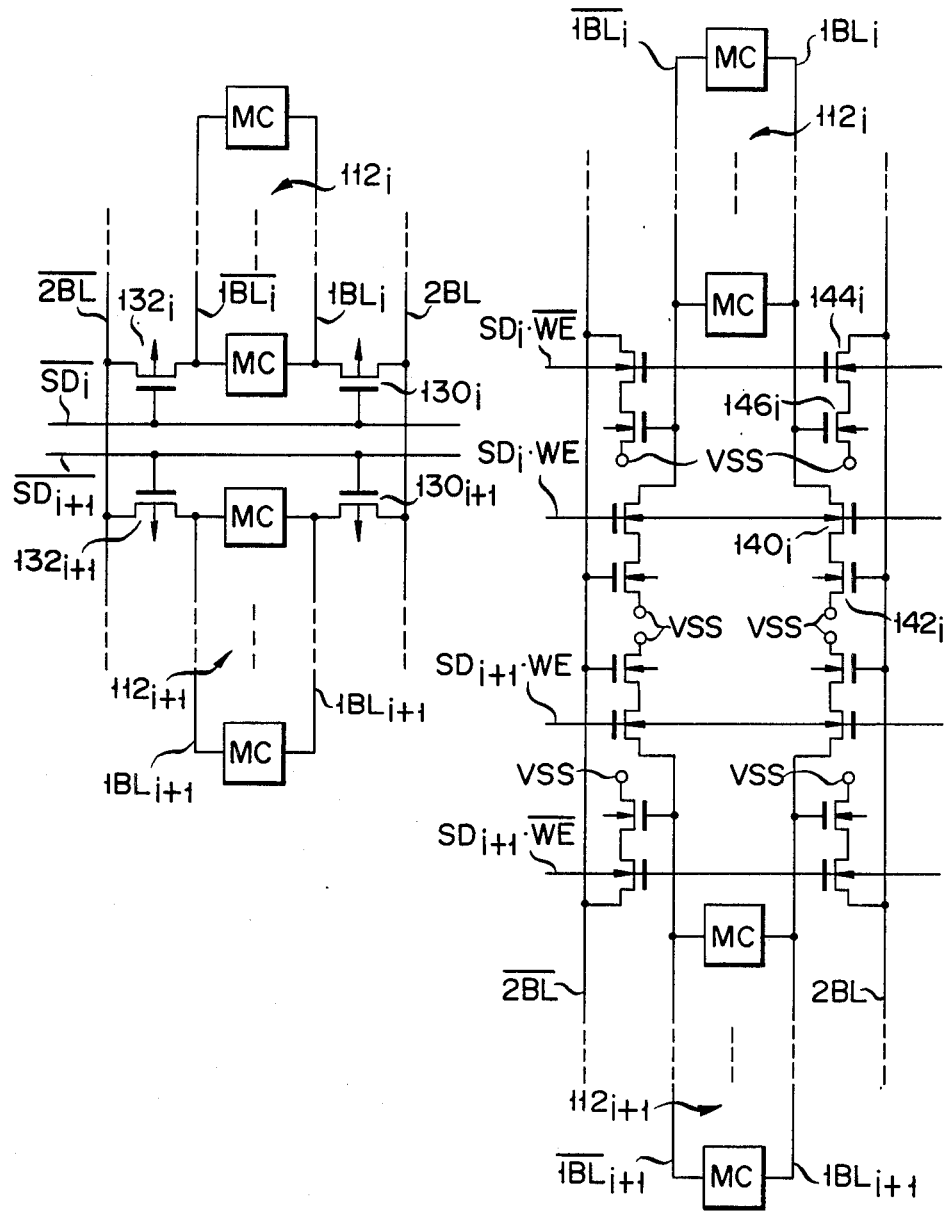
FIGS. 18 and 19 are circuit diagrams of the switch of the semiconductor memory device of the ninth embodiment.

An n-channel MOSFET may be used as the MOSFET transfer gate. In this case, a signal SD is supplied to the gate thereof. A CMOS transfer gate formed of a p-channel MOSFET and an n-channel MOSFET parallel-connected also may be used. As shown in FIG. 19, the bidirectional amplifier has four n-channel MOSFETs 140, 142, 144 and 146. The MOSFETs 140 and 142 are series-connected between the first bit line 1BL and the ground terminal VSS. The MOSFETs 144 and 146 are series-connected between the second bit line 2BL and the ground terminal VSS. The gate of the MOSFET 142 is connected to the second bit line 2BL, and the gate of the MOSFET 146 is connected to the first bit line 1BL. Signals SD·WE and SD·$\overline{WE}$ are supplied to the gates of the MOSFETs 140 and 144, respectively. The WE signal is a write/enable signal which is set at high level during writing operation.

The readout operation of the memory cell $110_1$ of the device will be described with reference to the timing charts in FIGS. 20A to 20D. Now assume that data of "1" is stored in the memory cell $110_1$. When the word line $WL_1$ goes high, as shown in FIG. 20A, the memory cell $110_1$ is energized. The first bit lines $1BL_1$ and $\overline{1BL}_1$ go to high level and low level as indicated by the solid and dotted lines in FIG. 20B, respectively. The output signal $SD_1$ from the row section decoder 120 goes to high level, as shown in FIG. 20C, and the switches $114_1$ and $116_1$ are turned on, so that the second bit lines 2BL and $\overline{2BL}$ are set at high level and low level as indicated by the solid and dotted lines in FIG. 20D, respectively. The signals on the second bit lines 2BL and $\overline{2BL}$ are amplified by the sense amplifier 126 through the bit line selection transistors T and $\overline{T}$ and the sense lines S and $\overline{S}$, respectively. In order to write data in the memory cell $110_1$, the write data is supplied from the sense lines S and $\overline{S}$ to the second bit lines 2BL and $\overline{2BL}$ through the bit line selection transistors T and $\overline{T}$.

According to this embodiment, only a pair of first bit lines 1BL and $\overline{1BL}$ are connected to the second bit lines 2BL and $\overline{2BL}$ when memory access is performed. For this reason, only n memory cells are connected to the bit lines, thereby decreasing the stray capacitance of the bit lines compared with that of the conventional memory device. As a result, the bit line delay time is shortened as compared with the delay time of the conventional memory device. For example, when a 256K bit SRAM of a bit line division system is used, 256 memory cells are connected to the single bit line. In this case, the stray capacitance of the bit line is 4 pF. When the 256 memory cells are divided into 16 sections (i.e., each section has 16 memory cells), the stray capacitance of the first bit line is 0.125 pF, which is 1/16 of 4 pF. The stray capacitance of the second bit line is calculated to be 0.8 pF. As a result, a total stray capacitance is 0.925 pF which is about a quarter of 4 pF. Therefore, the bit line delay time is decreased to $\frac{1}{4}$ as compared with the bit line delay time of the conventional memory device. For this reason, even if the memory capacity is increased, a high-speed semiconductor memory device can be obtained.

Figure 22:
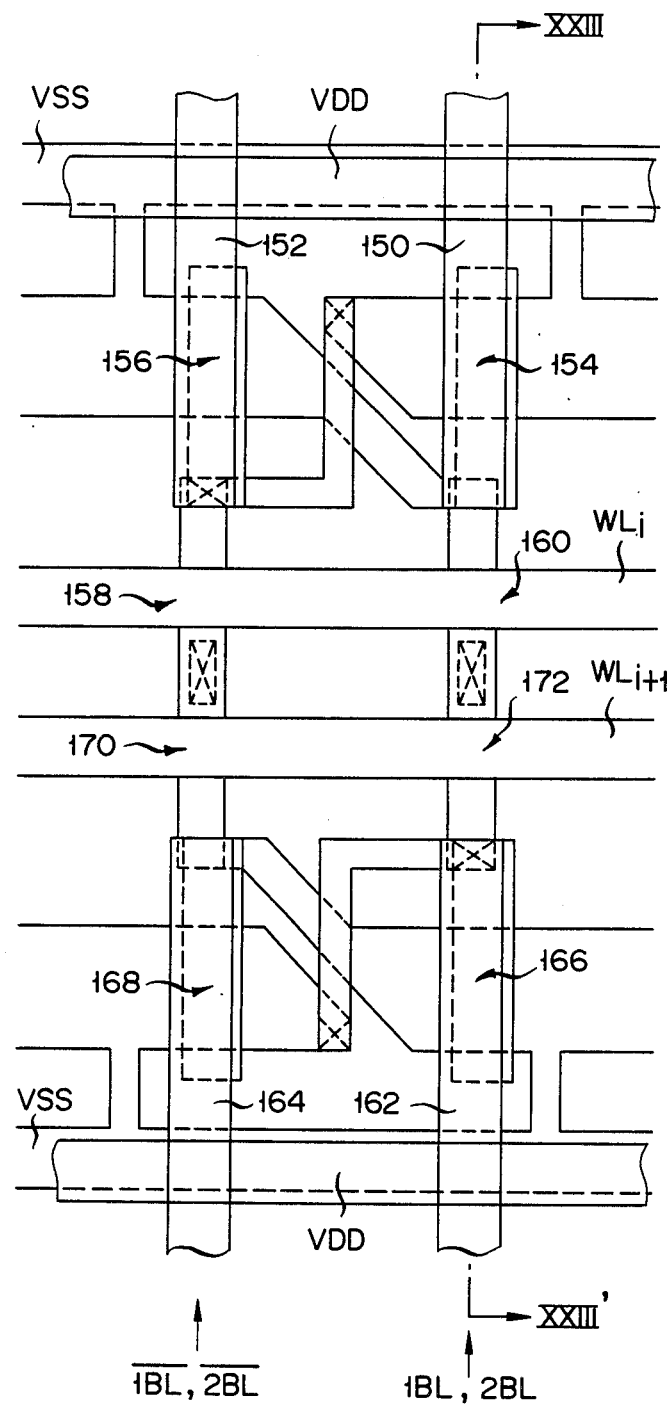
FIG. 22 is a plan view showing the pattern of the two memory cells shown in FIG. 21.

In the ninth embodiment, the double bit line structure can be obtained by a two-layer structure of the first and second bit lines. FIG. 21 shows a pattern of two memory cells for two rows and the first and second bit lines. FIG. 22 is a plan view of the pattern shown in FIG. 21, and FIG. 23 is a sectional view thereof taken along the line XXIII—XXIII' in FIG. 22. The same reference numerals denote the same parts throughout FIGS. 21 to 23. In the pattern shown in FIG. 22, the first and second bit lines are omitted for illustrative convenience. Each of the two memory cell patterns is symmetrically arranged with respect to the word lines so as to minimize the areas of the memory cells. MOSFETs 154, 156, 166 and 168 are MOSFETs with poly-Si gate. Resistors 150, 152, 162 and 164 are formed of a second polycrystalline silicon layer. The first and second bit lines are formed by first and second aluminum layers, respectively.

According to the present invention, double word or bit line structure is used, and the stray capacitance of the word or bit line is decreased. The delay time of the word or bit line is thus decreased, thereby obtaining a high-speed semiconductor memory device. The present invention is not limited to the particular embodiments described above. Various changes and modifications may be made within the spirit and scope of the present invention. For example, the word line or bit line is not limited to being doubled but may be of any number. Also, both the word line and the bit line together may be doubled or be of any number. In addition to these modifications, a CMOS SRAM cell or a DRAM cell may be used in place of the E/R RAM cell. In the above embodiment, one end of the bit line is connected to the corresponding precharge load transistor of a normally ON type. However, this precharge load transistor may be replaced with a p-channel MOSFET. In this case, the gate of the p-channel MOSFET is set at low level in the precharge mode and is set at high level in the readout mode, thereby arranging a bit-line precharge memory.

What is claimed is:

1. A semiconductor memory device comprising:
   a plurality of memory cells arranged in a two-dimensional matrix array of rows and columns, said memory cells in each of said rows being divided into a plurality of column sections;
   first word lines each connected to the memory cells in a different one of said column sections, said first word lines being organized into groups of word lines such that the memory cells connected to the first lines in each group of word lines are all in the same row of memory cells;
   second word lines; and
   switching means for connecting each of said second word lines to a different one of said group of first word lines.

2. A device according to claim 1, wherein said switching means comprises switches which are each connected between a different one of said second word lines and a different one of said first word lines in said corresponding group of first word lines, and which are controlled by a column section selection signal generated in response to a column address signal.

3. A device according to claim 2, wherein each said switch comprises
   a first MOSFET, a drain of which is connected to a different one of said second word lines and a source of which is connected to a different one of said first word lines in said corresponding group of first word lines, and
   a second MOSFET, a drain of which is connected to said different one of said first word lines in said corresponding group of first word lines and a source of which is connected to a reference power source, the column section selection signal being supplied to gates of said first and second MOSFETs.

4. A device according to claim 3, wherein said first and second MOSFETs are MOSFETs of different channel types whose gates are commonly connected.

5. A device according to claim 3, wherein said first and second MOSFETs are MOSFETs of the same channel type, a signal obtained by inverting a signal supplied to a gate of said first MOSFET being supplied to a gate of said second MOSFET.

6. A device according claim 2, wherein each said switch comprises
   a MOSFET, a drain of which is connected to a different one of said second word lines and a source of which is connected to a different one of said first word lines in said corresponding group of first word lines, and
   a resistor connected between said different one of said first word lines in said corresponding group of first word lines and a reference power source.

7. A device according to claim 2, wherein each said switch comprises
   a first MOSFET, a gate of which is connected to a different one of said second word lines and a source of which is connected to one of said first word lines in said corresponding group of first word lines, and
   a second MOSFET, a drain of which is connected to said different one of said first word lines in said corresponding group of first word lines and source of which is connected to a reference power source, the column section selection signal being supplied to a drain of said first MOSFET and a gate of said second MOSFET.

8. A device according to claim 2, wherein each said switch comprises
   a MOSFET, a gate of which is connected to a different one of said second word lines and a source of which is connected to a different one of said first word lines in said corresponding group and first word lines, and
   a resistor connected between said different one of said first word lines and a reference power source.

9. A device according to claim 2, wherein each said switch is connected at a center of one of said first word lines.

10. A device according to claim 2, wherein each said switch is a NOR gate.

11. A device according to claim 1, wherein each said first word line is formed of a first layer of polycrystalline silicon, and each said second word line is formed of a second layer of polycrystalline silicon.

12. A device according to claim 11, wherein each said memory cell is a static memory cell with a polycrystalline silicon high-resistance load, and each said second word line is formed by decreasing a resistance of said high-resistance load.

13. A device according to claim 1, wherein each said first word line is formed of a first layer of polycrystalline silicon, and each said second word line is formed of a second layer of aluminum.

14. A semiconductor memory device comprising:
    a plurality of memory cells arranged in a two-dimensional matrix array of rows and columns, said memory cells of each column being divided into a plurality of row sections;
    first bit lines each connected to the memory cells in a different one of said row sections, said first bit lines being divided into groups of first bit lines such that the memory cells in each group of first bit lines are all in the same column;
    second bit lines; and
    switching means for connecting each of said second bit lines to a different corresponding one of said group of first bit lines.

15. A device according to claim 14, wherein said switching means comprises switches which are each connected between a different one of said second bit lines and a different one of said first bit lines in said corresponding group of bit lines, and are each controlled by a row section selection signal generated in response to a row address signal.

16. A device according to claim 15, wherein each said switch is a MOSFET which is connected between a different one of said first bit lines in one of said groups of first bit lines and the corresponding one of said second bit lines, the row section selection signal being supplied to a gate of each said MOSFET.

17. A device according to claim 15, wherein each said switch is a bidirectional amplifier.

18. A device according to claim 1, wherein each said first bit line is formed of a first layer of aluminum, and each said second bit line is formed of a second layer of aluminum.

* * * * *